United States Patent
Van Blerkom et al.

(10) Patent No.: US 6,946,987 B1
(45) Date of Patent: Sep. 20, 2005

(54) COMMON OPERATIONAL AMPLIFIER AND GAIN CIRCUIT AND A/D CONVERTER USING THEREOF

(75) Inventors: Daniel Van Blerkom, Pasadena, CA (US); Steven Lei Huang, Pasadena, CA (US); I-Shiou Chen, Hsinchu (TW); Te-Sung Su, Hsinchu (TW)

(73) Assignee: Sunplus Technology Co., Ltd., Hsinchu (TW)

( * ) Notice: Subject to any disclaimer, the term of this patent is extended or adjusted under 35 U.S.C. 154(b) by 0 days.

(21) Appl. No.: 10/906,040

(22) Filed: Feb. 1, 2005

(30) Foreign Application Priority Data

Apr. 23, 2004 (TW) ............................... 93111370 A

(51) Int. Cl.⁷ .............................................. H03M 1/38
(52) U.S. Cl. ..................... 341/161; 341/118; 341/122; 250/208.1; 330/9; 330/264; 327/124
(58) Field of Search ..................... 341/161, 118, 122; 330/9, 264; 327/124, 108; 250/208.1

(56) References Cited

U.S. PATENT DOCUMENTS

| | | | | |
|---|---|---|---|---|
| 3,886,543 A | * | 5/1975 | Marin | 341/24 |
| 4,811,017 A | * | 3/1989 | Gulczynski | 341/145 |
| 6,262,626 B1 | * | 7/2001 | Bakker et al. | 330/9 |
| 6,512,221 B2 | * | 1/2003 | Yen et al. | 250/208.1 |
| 6,734,723 B2 | * | 5/2004 | Huijsing et al. | 330/9 |

* cited by examiner

Primary Examiner—Lam T. Mai
(74) Attorney, Agent, or Firm—Jiang Chyun IP Office

(57) ABSTRACT

A common operational amplifier for a pipeline circuit is provided. The common operational amplifier is used by the stage circuits of the pipeline circuit by turns according to a predetermined timing. The common operational amplifier comprises an operational amplifier circuit, a multiplexer circuit and a demultiplexer circuit. The multiplexer circuit is provided for selecting a signal set of a stage circuit to be amplified to couple to the operational amplifier circuit, and the demultiplexer circuit is provided for transmitting the amplified signal set to the corresponding stage circuit.

9 Claims, 7 Drawing Sheets

COMMON OPERATIONAL AMPLIFIER AND GAIN CIRCUIT AND A/D CONVERTER USING THEREOF

CROSS-REFERENCE TO RELATED APPLICATION

This application claims the priority benefit of Taiwan application serial no. 93111370, filed Apr. 23, 2004.

BACKGROUND OF THE INVENTION

1. Field of the Invention

The present invention relates to an operational amplifier. More particularly, the present invention relates to a pipeline circuit having a common operational amplifier.

2. Description of Related Art

Conventionally, in a variety of electronic circuits, the pipeline circuit is generally adopted for processing signals of each stage. In some of the pipeline circuits, an operational amplifier circuit is provided for each stage circuit to gain the corresponding signal respectively. Therefore, each operational amplifier circuit is only used in some specific period of time otherwise remains idle. Hereinafter, an image sensor will be illustrated as an example.

In recent years, image capture function or device is built in a variety of electronic appliances, especially mobile device such as mobile phone, personal digital assistant (PDA) or even toy. The specification of the image capture device is dependent on the electronic appliances. For the mobile device, a low power consumption and high definition image sensor is required for the image capture device. FIG. 1A is a schematic block diagram illustrating a conventional image sensor. Referring to FIG. 1A, a conventional image sensor includes a pixel array 110, row driver and voltage generator 120, sample and hold column circuit 130, gain circuit 140 and analog/digital (A/D) converter 150. The row driver and voltage generator 120 provides a plurality of driving signals of rows 121, a plurality of reference voltages 122 and a reference voltage VCL. The driving signals of rows 121 are received by the corresponding electrodes (not shown) of the pixel array 110 respectively. The image is sensed by the pixel array, and then a plurality of pixel signals of columns 111 are outputted according to the timing of the driving signals of rows 121. The pixel signals of columns 111 are received, sampled and held sample by the hold column circuit 130. Then, the pixel signals are arranged in cascade to generate a pixel signal 131. The pixel signal 131 is received and amplified by the gain circuit 140 to generate a pixel signal 141. The A/D converter circuit 150 generally includes a pipeline A/D converter circuit, wherein the analog pixel signal 141 is converted into a digital pixel signal 151 according to the reference voltages 122. The digital pixel signal 151 is outputted to the successive circuit (e.g., the control logic circuit 160 shown in FIG. 1).

Generally, in the image sensor of FIG. 1A, the gain circuit 140 and the A/D converter circuit 150 have pipeline structure. FIG. 1B is a circuit diagram illustrating a conventional pipeline gain circuit. Referring to FIG. 1B, the gain circuit 140 of FIG. 1A including a pre-stage gain block 142 and a post-stage gain block 143 is illustrated. Each stage of gain blocks includes a sample circuit 144 or 146 and an amplifier circuit 145 or 147 respectively. Therefore, the signal is sampled and held in the sample circuit, and then is gained by the amplifier circuit. For example, the pixel signal 131 is amplified by the gain circuit 140, the pre-stage gain block 142 is set at a sampling phase (or represented as a reset phase), thus the pixel signal 131 is held in the capacitors C1 and C2. At this moment, the post-stage gain block 143 is set at a gain phase, the pixel signal 148 held in the capacitors C5 and C6 is provided by the sample circuit 146 and gained by the operational amplifier circuit OP2 to output a pixel signal 141. In other words, referring to the circuit diagram illustrated in FIG. 1B, the sense switches SW1 to SW6 are turned on and the sense switches SW7 to SW12 are turned off. At this moment, the operational amplifier circuit OP1 is idle. After the pixel signal 131 is sampled and held by the sample circuit 144 of the pre-stage gain block 142, the pre-stage gain block 142 is set at gain phase. The pixel signal 131 provided by the sample circuit 146 is gained by the pixel signal 148 via operational amplifier circuit OP1 and outputted. At this moment, the post-stage gain block 143 is set at reset phase, and the pixel signal 148 is sampled and held. In other words, referring to the circuit diagram illustrated in FIG. 1B, the sense switches SW1 to SW6 are turned off and the sense switches SW7 to SW12 are turned on. At this moment, the operational amplifier circuit OP2 is idle. By repeating the steps described above, the pixel signal 131 is gained to be a pixel signal 141 and outputted by the gain circuit 140.

Accordingly, it is noted that, when the operational amplifier circuit OP1 is used, the operational amplifier circuit OP2 is idle, and vice versa (i.e., when the operational amplifier circuit OP2 is used, the operational amplifier circuit OP1 is idle). Generally, in order to maintain the gain of the operational amplifier at high level, a specific DC power is adopted for the operational amplifier. Therefore, in an analog circuit, the amplifier consumes more power. For example, pipeline analog digital converter and pipeline gain circuit are adopted for a complementary metal oxide semiconductor (CMOS) transistor image sensor. Therefore, each stage of the CMOS image sensor includes an operational amplifier circuit. However, in the timing of sample and hold of the circuit, the operational amplifier circuits are only operated about every half-period, thus, about half-period of power is consumed. Therefore, the power is consumed due to the idling of the operational amplifier circuits. Furthermore, the area and cost of the circuit is increased since in the pipeline circuit, each stage circuit includes an operational amplifier circuit.

SUMMARY OF THE INVENTION

Therefore, the present invention is directed a common operational amplifier for a pipeline circuit. Therefore, the common operational amplifier is used by a plurality of stage circuits of the pipeline circuit by turns according to a predetermined timing. Thus, the power consumption, the circuit area and the cost are reduced.

The present invention is also directed to a pipeline gain circuit including a common operational amplifier for reducing the power consumption, circuit area and cost.

The present invention is also directed to a pipeline A/D converter circuit including a common operational amplifier for reducing the power consumption, circuit area and cost.

In accordance with one embodiment of the present invention, a common operational amplifier for a pipeline circuit is provided. The pipeline circuit comprises, for example but not limited to, a plurality of stage circuits, wherein the common operational amplifier is used by the stage circuits by turns according to a predetermined timing. The common operational amplifier comprises, for example but not limited to, an operational amplifier circuit, a multiplexer circuit and a demultiplexer circuit. The operational amplifier circuit is provided for receiving and amplifying a first signal set, and outputting a second signal set correspondingly. The multiplexer circuit comprises a plurality of first input terminal sets and an first output terminal set for selecting one of the first input terminal sets by turns according to the predetermined timing. The selected one of the first input terminal set is connected to the first output terminal set, wherein each of the first input terminal sets is respectively connected to each of the stage circuits correspondingly to receive a third signal set of each of the stage circuits. The first output terminal set is connected to the operational amplifier circuit to output the first signal set. The demultiplexer circuit comprises a second input terminal set and a plurality of second output terminal sets for selecting one of the second output terminal sets by turns according to the predetermined timing. The second input terminal set is connected to the selected one of the second output terminal set, wherein the second input terminal set is connected to the operational amplifier circuit to receive the second signal set. Each of the second output terminal sets respectively connected to each of the stage circuits correspondingly to output a plurality of 4th signal set.

In one embodiment of the present invention, the common operational amplifier can be adopted for a readout circuit of an image sensor. The image sensor comprises, for example but not limited to, a CMOS image sensor.

In accordance with one embodiment of the present invention, a pipeline gain circuit for receiving and amplifying a first signal set and outputting a second signal set is provided. The gain circuit comprises a pre-stage gain block, a post-stage gain block and a common operational amplifier. The pre-stage gain block comprises a pre-sample circuit and a pre-amplifier circuit. The pre-sample circuit is provided for receiving and sampling the first signal set during a first period, and holding the first signal set sampled as a third signal set. The pre-amplifier circuit is provided for receiving and amplifying the third signal set during a second period, and outputting a 4th signal set. The post-stage gain block is connected to the pre-stage gain block, and comprises a post-sample circuit and a post-amplifier circuit. The post-sample circuit is provided for receiving and sampling the 4th signal set during the second period, and holding the 4th signal set sampled as a 5th signal set. The post-amplifier circuit is provided for receiving and amplifying the 5th signal set during the first period, and outputting the second signal set. The common operational amplifier comprises an operational amplifier circuit for receiving and amplifying a 6th signal set, and outputting a 7th signal set correspondingly. The multiplexer circuit is connected to the operational amplifier circuit, the pre-amplifier circuit and the post-amplifier circuit, and provided for receiving the third signal set and the 5th signal set, selecting the 5th signal set and the third signal during the first period and the second period respectively, and outputting the 6th signal set. The demultiplexer circuit is connected to the operational amplifier circuit, the pre-amplifier circuit and the post-amplifier circuit, and is provided for receiving and switching the 7th signal set during the first period and the second period to provide the second signal set and the 4th signal set respectively.

In accordance with one embodiment of the present invention, a pipeline A/D converter circuit, for receiving a first analog signal and outputting a first digital signal correspondingly is provided. The A/D converter circuit comprises a pre-A/D converter, a post-A/D converter and a common operational amplifier. The pre-A/D converter comprises a pre-sample and converter circuit and a pre-amplifier circuit. The pre-sample and converter circuit is provided for receiving and sampling/holding a first analog signal to be a second analog signal during a first period. The second analog signal is converted into a second digital signal correspondingly, and the second digital signal is converted into a third analog signal correspondingly. Then, the third analog signal is subtracted from the second analog signal to obtain and output a 4th analog signal, wherein the second digital signal is a first portion bit signal of the first digital signal. The pre-amplifier circuit is provided for receiving and amplifying the 4th analog signal during a second period, and outputting a 5th analog signal. The post-A/D converter is connected to the pre-A/D converter and comprises a post-sample and converter circuit and a post-amplifier circuit. The post-sample and converter circuit is provided for receiving and sampling/holding the 5th analog signal to be a 6th analog signal during the first period. The 6th analog signal is converted into a third digital signal correspondingly, and the third digital signal is converted into a 7th analog signal correspondingly. Then, the 7th analog signal is subtracted from the 6th analog signal to obtain and output an 8th analog signal, wherein the third digital signal is a second portion bit signal of the first digital signal. The post-amplifier circuit is provided for receiving and amplifying the 8th analog signal during the first period, and outputting a 9th analog signal. The common operational amplifier comprises, for example but not limited to, an operational amplifier circuit, a multiplexer circuit and a demultiplexer circuit. The operational amplifier circuit is provided for receiving and amplifying an 11thalog signal, and outputting an 11th analog signal correspondingly. The multiplexer circuit is connected to the operational amplifier circuit, the pre-amplifier circuit and the post-amplifier circuit. The multiplexer circuit is provided for receiving the 4th analog signal and the 8th analog signal, selecting the 8th analog signal and the 4th analog signal during the first period and the second period respectively, and outputting the 11thalog signal. The demultiplexer circuit is connected to the operational amplifier circuit, the pre-amplifier circuit and the post-amplifier circuit, and provided for receiving and switching the 11th analog signal during the first period and the second period to provide the 9th analog signal and the 5th analog signal respectively.

Accordingly, in the present invention, since a common operational amplifier is commonly used by the stage circuits of the pipeline circuit (for example but not limited to, an operational amplifier is commonly used by two adjacent stages of gain circuit, the amount of the operational amplifier is minimized drastically. Therefore, the duty cycle of the operational amplifiers are increased, and thus the power consumption, the layout area of the circuit and the cost are reduced drastically.

One or part or all of these and other features and advantages of the present invention will become readily apparent to those skilled in this art from the following description wherein there is shown and described a preferred embodiment of this invention, simply by way of illustration of one of the modes best suited to carry out the invention. As it will be realized, the invention is capable of different embodiments, and its several details are capable of modifications in various, obvious aspects all without departing from the invention. Accordingly, the drawings and descriptions will be regarded as illustrative in nature and not as restrictive.

BRIEF DESCRIPTION OF THE DRAWINGS

The accompanying drawings are included to provide a further understanding of the present invention, and are incorporated in and constitute a part of this specification.

The drawings illustrate embodiments of the present invention and, together with the description, serve to explain the principles of the present invention.

DESCRIPTION OF THE EMBODIMENTS

The present invention will be described fully hereinafter with reference to the accompanying drawings, in which preferred embodiments of the present invention are illustrated. The present invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements in the accompanying drawings throughout.

Figure 2:
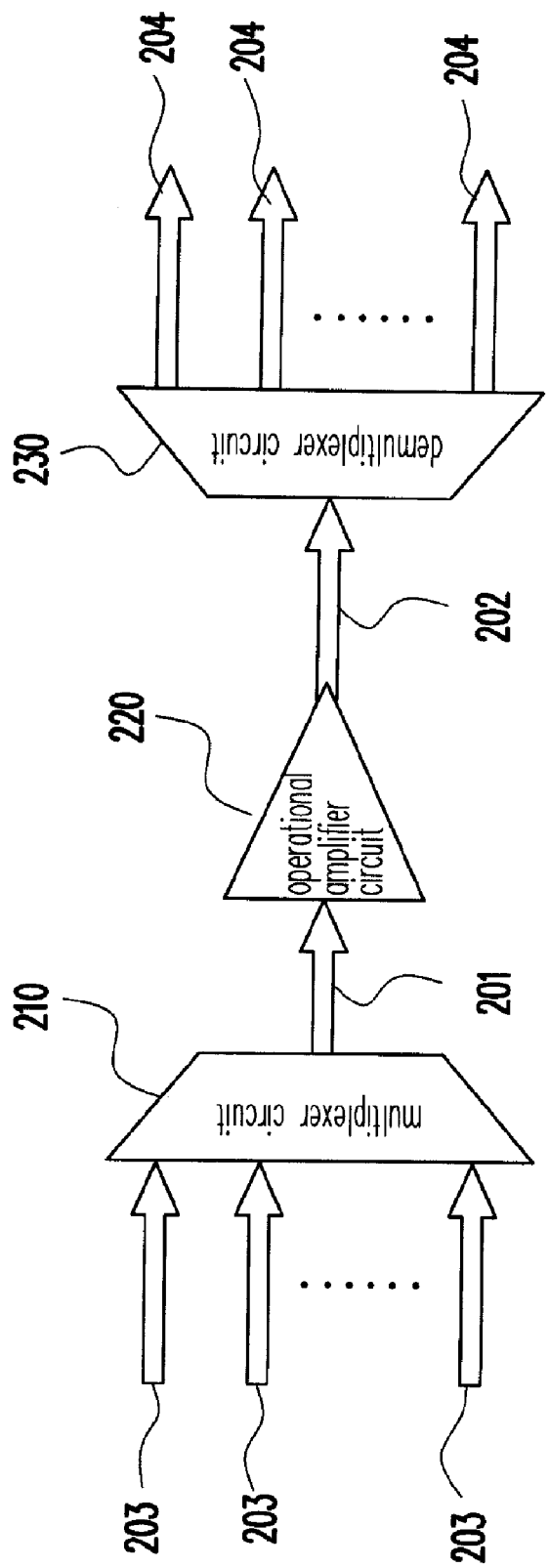
FIG. 2 is a schematic block diagram illustrating a common operational amplifier according to one embodiment of the present invention.

FIG. 2 is a schematic block diagram illustrating a common operational amplifier according to one embodiment of the present invention. Referring to FIG. 2, the common operational amplifier is generally adopted for, such as, a pipeline circuit. In general, a pipeline circuit comprises a plurality of stage circuits, wherein the common operational amplifier is used by the stage circuits by turns according to a predetermined timing. Referring to FIG. 2, a plurality of signal sets 203 represent the original signal sets of the stage circuits to be amplified respectively. The multiplexer circuit 210 selects one of the signal sets 203 by turns according to the predetermined timing, and then the selected signal set 203 is connected and outputted as a signal set 201. The operational amplifier circuit 220 receives and amplifies the signal set 201, and outputs a corresponding signal set 202. The demultiplexer circuit 230 selects one of the output terminal sets by turns according to the predetermined timing corresponding to the multiplexer circuit 210, and the signal set 202 is connected to the selected output terminal set to output a signal set 204. As shown in FIG. 2, a plurality of signal sets 204 are provided by each of the output terminal sets of the demultiplexer circuit 230 respectively, and connected to the corresponding stage circuit to amplify the signal.

In one embodiment of the present invention, the common operational amplifier may be adopted for, such as a readout circuit of an image sensor. The image sensor comprises, for example but not limited to, a CMOS image sensor.

Figure 1A:
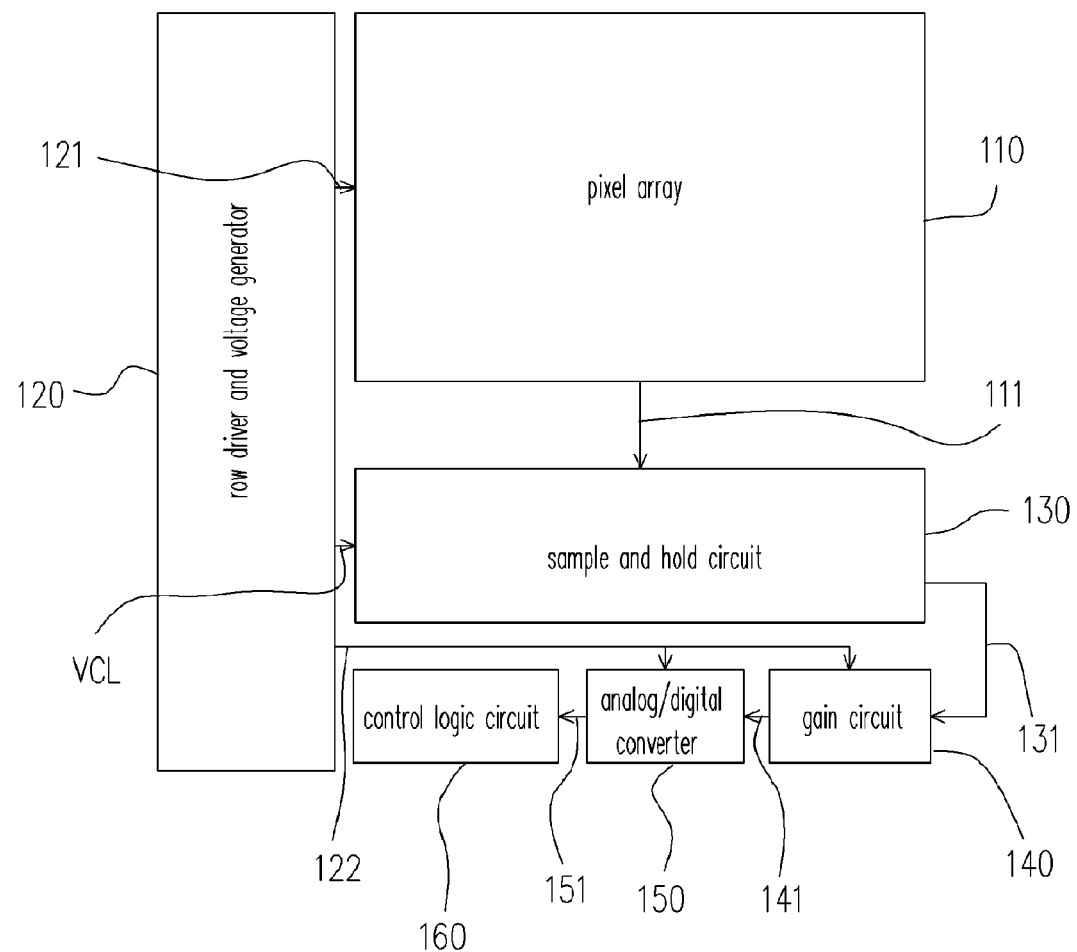
FIG. 1A is a schematic block diagram illustrating a conventional image sensor.
Figure 1B:
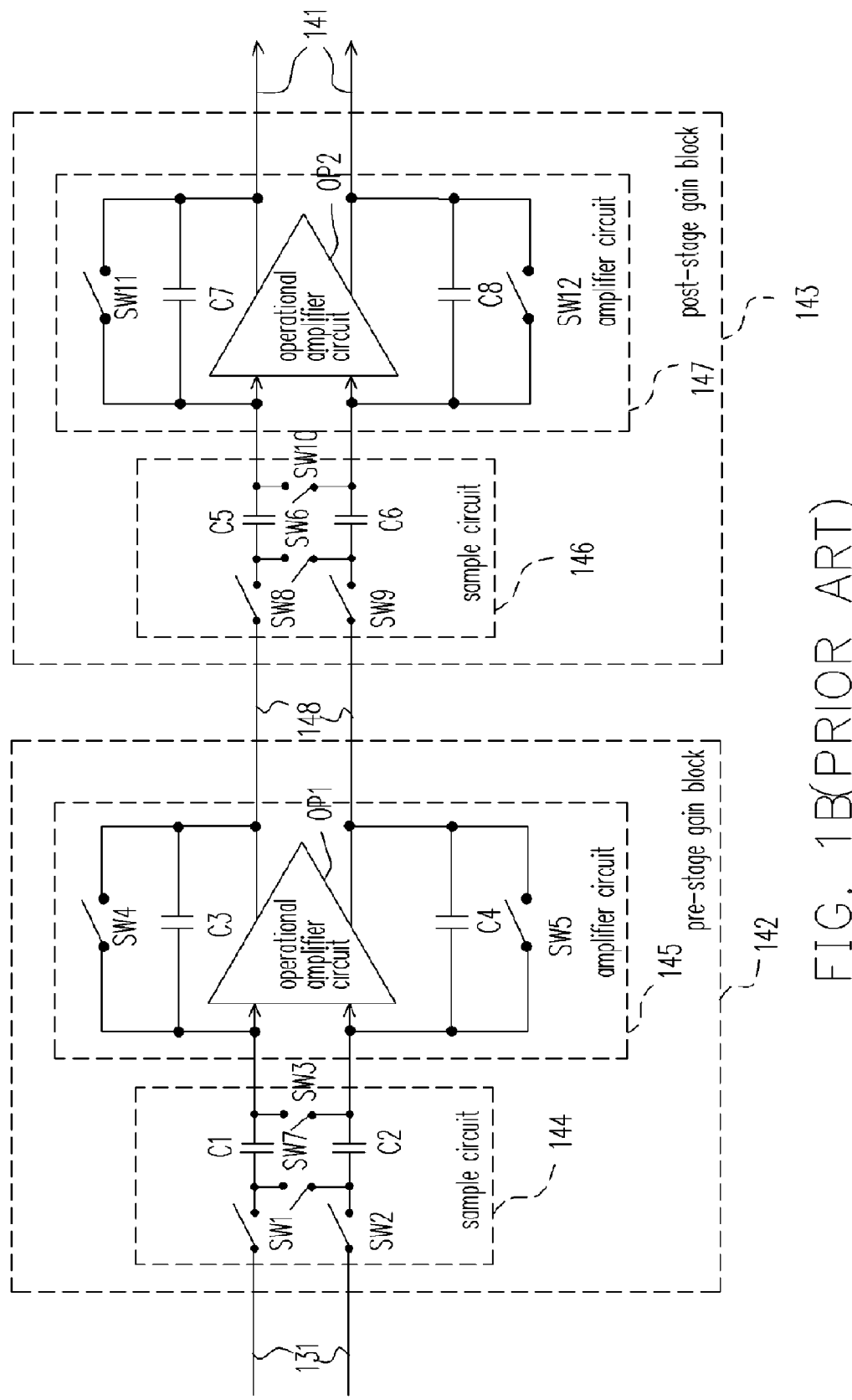
FIG. 1B is a circuit diagram illustrating a conventional pipeline gain circuit.
Figure 3:
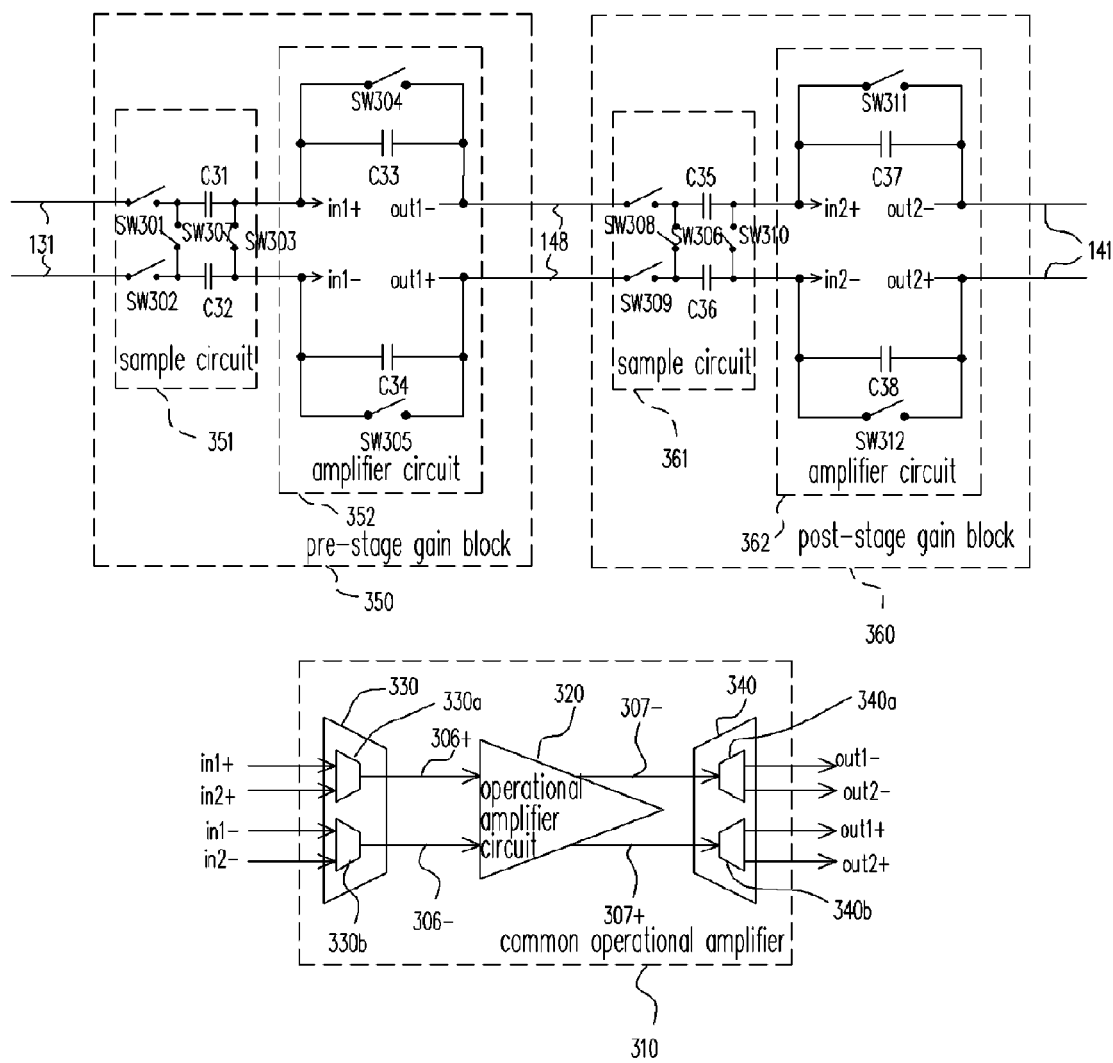
FIG. 3 is a pipeline gain circuit diagram including a common operational amplifier according to one embodiment of the present invention.

Hereinafter, another embodiment of the present invention is illustrated to further describe the present invention. FIG. 3 is a pipeline gain circuit including a common operational amplifier according to another embodiment of the present invention. In the present embodiment, the circuit shown in FIG. 3 is adopted for, for example but not limited to, a gain circuit of a CMOS image sensor (e.g., the gain circuit 140 of FIG. 1A). However, it should be noted that the present invention may also be applied for another circuit having a pipeline circuit and an amplifier circuit. The gain circuit of the CMOS image sensor comprises, for example but not limited to, a pre-stage gain block 350 and a post-stage gain block 360. The pre-stage and the post-stage gain blocks 350 and 360 comprise a sample circuits 351 and 361 and amplifier circuits 352 and 362 respectively. Referring to FIG. 3, the signal is sampled and held in the sample circuit, and then is gained by the amplifier circuit. In other words, when the pixel signal 131 is amplified to obtain a gained pixel signal 141, the pre-stage gain block 350 is operated at a sampling phase (or called a reset phase) to store the pixel signal 131 in the capacitors C31 and C32. At this moment, the post-stage gain block 360 is operated at a gain phase.

When the pre-stage gain block 350 is operated at the reset phase (i.e., the post-stage gain block 360 is at gain phase), signal in2+ and signal in2− are selected by the multiplexer circuit 330 of the common operational amplifier 310 and coupled to signal 306+ and signal 306− respectively. Signal out2− and signal out2+ are selected by the demultiplexer circuit 340 and coupled to signal 307− and signal 307+ respectively. The sense switches SW301 to SW306 are turned on and the sense switches SW307 to SW312 are turned off. The pixel signal 131 is received by the sample circuit 351 of the pre-stage gain block 350 and sampled/held in the capacitors C31 and C32. The pixel signal 148 outputted by the pre-stage gain block 350 is stored in the capacitors C35 and C36 of the sample circuit 361 of the post-stage gain block 360 and outputted as signal in2+ and signal in2−, and then gained by the operational amplifier circuit 320 to output the pixel signal 141.

When the pre-stage gain block 350 is at gain phase (i.e., the post-stage gain block 360 is at reset phase), signal in1+ and signal in1− are selected by the multiplexer circuit 330 of the common operational amplifier 310 and coupled to signal 306+ and signal 306− respectively. Signal out1− and signal out1+ are selected by the demultiplexer circuit 340 and coupled to signal 307− and signal 307+ respectively. The sense switches SW301 to SW306 are turned off, and the sense switches SW307 to SW312 are turned on. The pixel signal sampled previously is provided by the sample circuit 351 and transmitted to the common operational amplifier 310 via the signal terminal in1+ and in1−, and then gained to output a pixel signal 148. At this moment, the pixel signal 148 is sampled by the sample circuit 361 of the post-stage gain block 360. Thereafter, by repetition of the operation described above, the pixel signal 131 is gained and outputted to a pixel signal 141 via the gain circuit 140.

In one embodiment of the present invention, the multiplexer circuit 330 comprises, for example but not limited to, a multiplexer 330a and a multiplexer 330b, and the demultiplexer circuit 340 comprises, for example, a demultiplexer 340a and a demultiplexer 340b. The multiplexer 330a is adopted for selecting and switching the signals in1+ and in2+ to couple to the signal 306+. The multiplexer 330b is adopted for selecting and switching the signals in1− and in2− to couple to the signal 306−. The demultiplexer 340a is adopted for selecting and switching the signals out1− and out2− to couple to the signal 307−. The demultiplexer 340b is adopted for selecting and switching the signals out1+ and out2+ to couple to the signal 307+.

Figure 4:
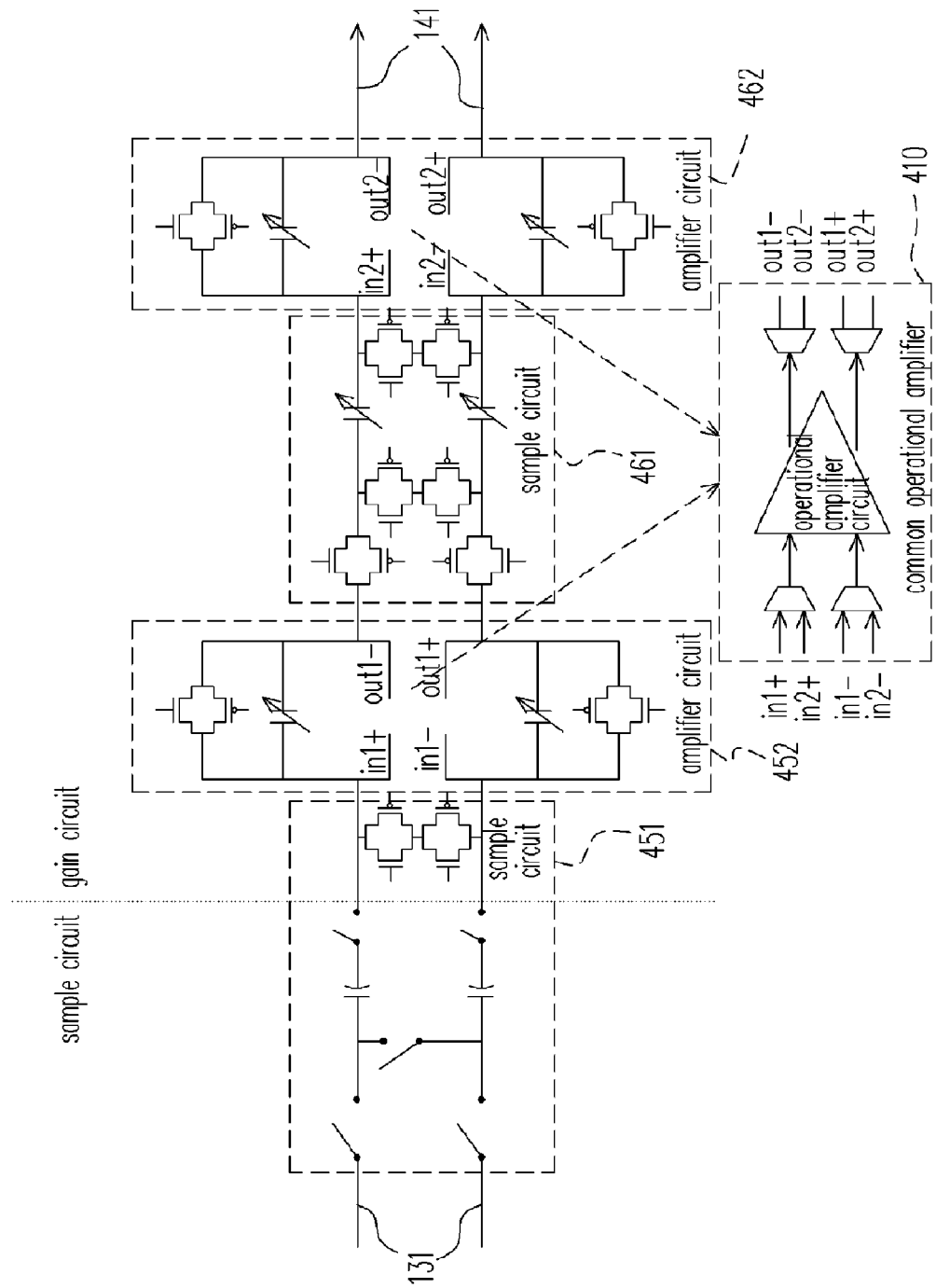
FIG. 4 is a pipeline gain circuit diagram including a common operational amplifier according to another embodiment of the present invention.

In one embodiment of the present invention, the sense switches comprise, for example but not limited to, transmission gates. FIG. 4 is a pipeline gain circuit including a common operational amplifier according to another embodiment of the present invention. For example but not limited to, in the pipeline gain circuit of FIG. 4, the sense switches shown in FIG. 3 is replaced by transmission gates. In addition, the sample circuit 451, the amplifier circuit 452, the sample circuit 461, the amplifier circuit 462, the common operational amplifier 410 of FIG. 4 correspond to the sample circuit 351, the amplifier circuit 352, the sample circuit 361, the amplifier circuit 362, the common operational amplifier 310 of FIG. 3 respectively. At the left side of FIG. 4, a portion of the circuit of the sample circuit 451 is integrated with the sample and hold column circuit of the prior stage (Referring to FIG. 1A). Therefore, the amount of circuit components is reduced. Another portion of the circuit of FIG. 4 is similar to that of FIG. 3 and will no more be described.

Figure 5:
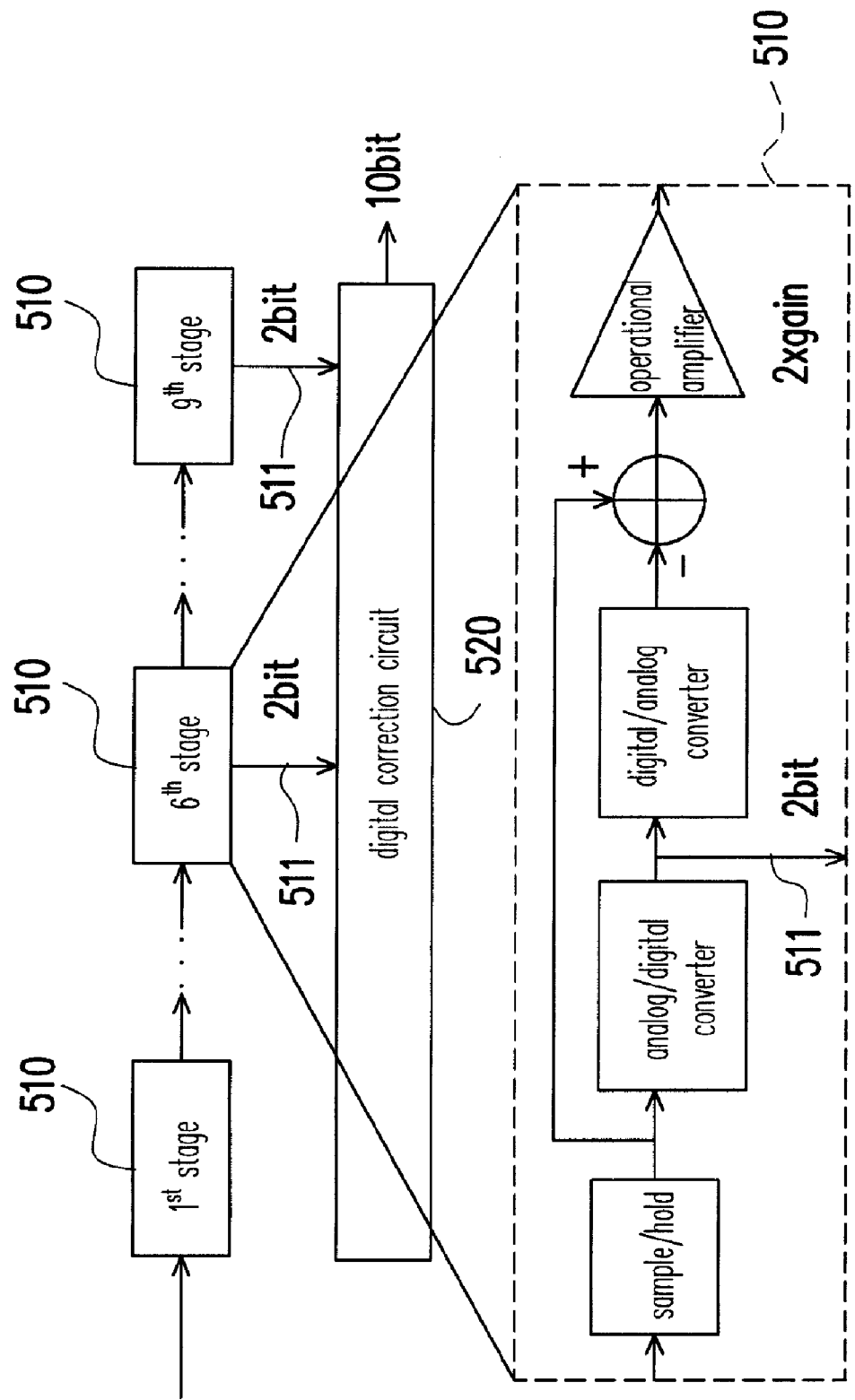
FIG. 5 is a schematic block diagram illustrating a pipeline A/D converter circuit according to one embodiment of the present invention.

FIG. 5 is a schematic block diagram illustrating a pipeline A/D converter circuit according to one embodiment of the present invention. The pipeline A/D converter circuit includes a plurality of converter circuits 510, for example, having 9 stage converter circuits connected in cascade. In each stage, a portion of the information of an analog signal is converted into a digital signal 511 including less bits (e.g., 2 bits), and a residue analog signal formed by eliminating the converted portion from the original analog signal is amplified and transmitted to next stage converter circuit 510. The digital signal 511 outputted by each stage converter circuit 510 is coupled to a digital correction circuit 520. The digital correction circuit 520 is adopted for receiving the digital signal 511 outputted from each stage converter circuit 510, wherein all the digital signal 511 include, for example, 12 bits. Then, a digital error correction is performed to the received digital signal. Therefore, a final digital signal including, for example, 10 bits is formed and outputted. It should be noted that, each stage of the pipeline A/D converter circuit may be used to sample/hold and gain the output. Therefore, the amount of the operational amplifier of present invention is reduced.

Figure 6:
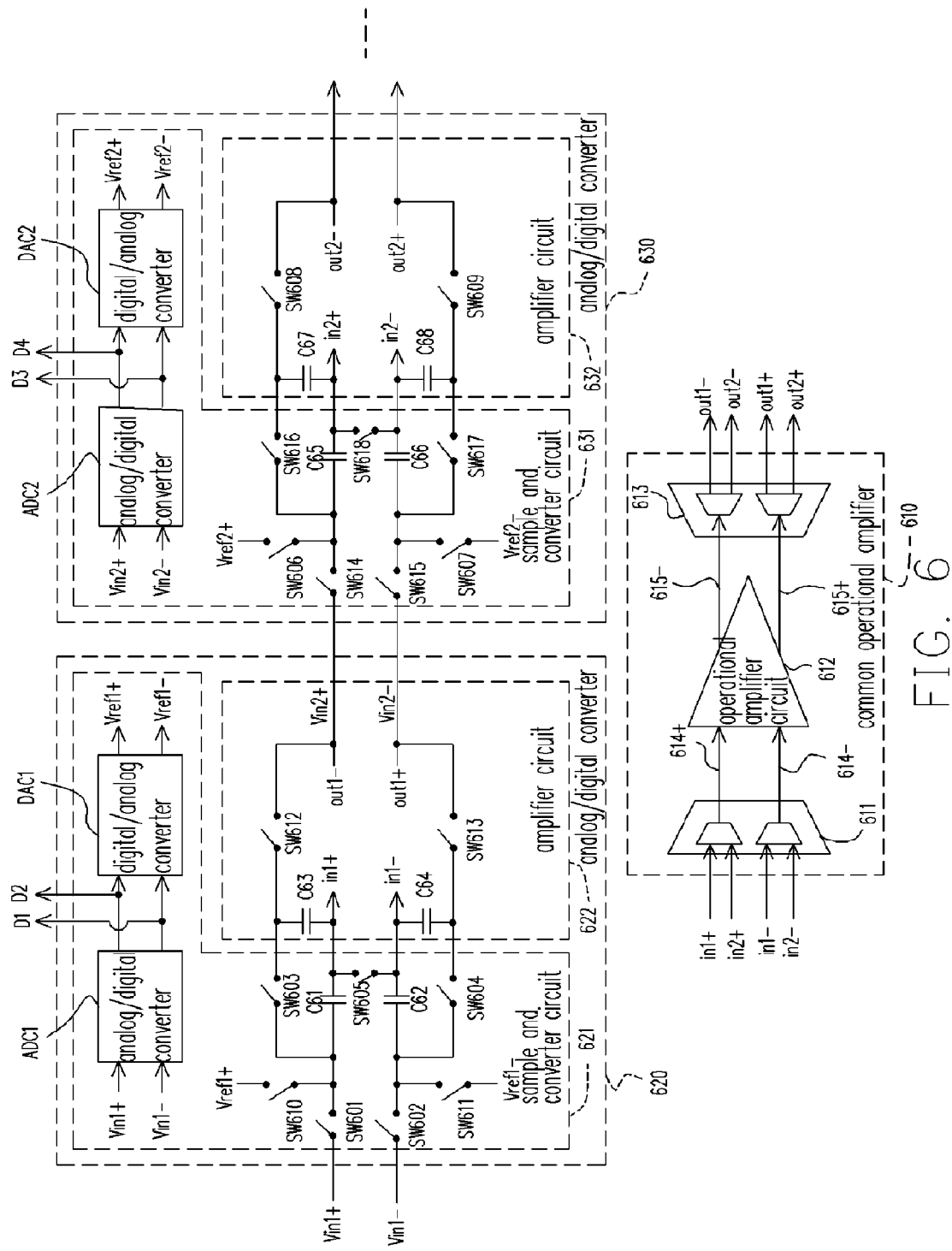
FIG. 6 is a pipeline A/D converter circuit diagram including a common operational amplifier according to one embodiment of the present invention.

Hereinafter, an exemplary example of the present invention adopted for a pipeline A/D converter circuit will be illustrated. FIG. 6 is a pipeline A/D converter circuit diagram including a common operational amplifier according to one embodiment of the present invention. Referring to FIG. 6, A/D converters 620 and 630 represent two adjacent stage converter circuits of a pipeline A/D converter circuit, wherein the A/D converter 620 is a pre-stage converter circuit of the A/D converter 630. Each stage of the A/D converter comprises at least a sample and converter circuit (e.g., the sample and converter circuit 621 or 631 shown in FIG. 6) and an amplifier circuit (e.g., the amplifier circuit 622 or 632). The sample and converter circuit is adopted for, for example, sampling and holding an analog signal received from a pre-stage circuit at a sampling phase, and then converting the analog signal into a digital signal for output. The amplifier circuit is used to, for example, gain the analog signal generated by subtracting the converted portion of the residue analog signal from the analog signal held in the sample and converter circuit at gain phase for output. It is noted that, when the A/D converter 620 is at sampling phase, the A/D converter 630 is at gain phase. Alternatively, when the A/D converter 620 is at gain phase, the A/D converter 630 is at sampling phase.

When the A/D converter 620 is at sampling phase (i.e., the A/D converter 630 is at gain phase), in the common operational amplifier 610, signals in2+ and in2− are selected by the multiplexer circuit 611 and coupled to signals 614+ and 614− respectively. Signals out2− and out2+ are selected by the demultiplexer circuit 613 and coupled to the signals 615− and 615+ respectively. The sense switches SW601 to SW609 are turned on and the sense switches SW610 to SW618 are turned off. At this moment, analog signal (Vin1+, Vin1−) is sampled and held in the capacitors C61 and C62. The A/D converter ADC1 is adopted for, for example but not limited to, converting the analog signal (Vin1+, Vin1−) into a two-bits digital signal (D1, D2). The D/A converter DAC1 is adopted for, for example but not limited to, converting the digital signal (D1, D2) into analog signal (Vref1+, Vref1−), wherein the analog signal (Vref1+, Vref1−) is provided as a reference voltage of the capacitors C61 and C62 at gain phase. In the A/D converter 630, the analog signal (in2+, in2−) held in the capacitors C65 and C66 is provided by the sample and converter circuit 631 and gained by the operational amplifier circuit 612 to obtain an analog signal (out2−, out2+) for output.

When the A/D converter 620 is at gain phase (i.e., the A/D converter 630 is at sampling phase), in the common operational amplifier 610, signals in1+ and in1− are selected by the multiplexer circuit 611 and coupled to signals 614+ and 614− respectively. Signals out1− and out1+ are selected by the demultiplexer circuit 613 and coupled to signals 615− and 615+ respectively. The sense switches SW601 to SW609 are turned off and the sense switches SW610 to SW618 are turned on. At this moment, in the A/D converter 620, the analog signal (in1+, in1−) held in the capacitors C61 and C62 is provided by the sample and converter circuit 621, gained by the operational amplifier circuit 612 to obtain an analog signal (Vin2+, Vin2−) for output. The A/D converter 630 is adopted for receiving the analog signal (Vin2+, Vin2−) and sampling/holding in the capacitors C65 and C66. The A/D converter ADC2 is adopted for, for example but not limited to, converting the analog signal (Vin2+, Vin2−) into a two-bits digital signal (D3, D4). The D/A converter DAC2 is adopted for, for example but not limited to, converting the digital signal (D3, D4) into an analog signal (Vref2+, Vref2−), wherein the analog signal (Vref2+, Vref2−) is provide as a reference voltage of the capacitor C65 and C66 at the gain phase.

It is noted that, the common operational amplifier 610 is similar to the common operational amplifier 310 and detailed description thereof will not be repeated.

The foregoing description of the embodiment of the present invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A common operational amplifier for a pipeline circuit, the pipeline circuit comprising a plurality of stage circuits, and the common operational amplifier being used by the stage circuits by turns according to a predetermined timing, the common operational amplifier comprising:

an operational amplifier circuit, for receiving and amplifying a first signal set, and outputting a second signal set correspondingly;

a multiplexer circuit, comprising a plurality of first input terminal sets and an first output terminal set, for selecting one of the first input terminal sets by turns according to the predetermined timing, and the selected one of the first input terminal set is connected to the first output terminal set, wherein each of first the input terminal sets is respectively connected to each of the stage circuits correspondingly to receive a third signal set of each of the stage circuits, and the first output terminal set is connected to the operational amplifier circuit to output the first signal set; and a demultiplexer circuit, comprising a second input terminal set and a plurality of second output terminal set, for selecting one of the second output terminal sets by turns according to the predetermined timing, and the second input terminal set is connected to the selected one of the second output terminal set, wherein the second input terminal set is connected to the operational amplifier circuit to receive the second signal set, and each of the second output terminal sets respectively connected to each of the stage circuits correspondingly to output a plurality of 4th signal set.

2. The common operational amplifier of claim 1, wherein the common operational amplifier is adopted as a readout circuit of an image sensor.

3. The common operational amplifier of claim 2, wherein the image sensor comprises a complementary metal oxide semiconductor (CMOS) image sensor.

4. A pipeline gain circuit, for receiving and amplifying a first signal set and outputting a second signal set, the gain circuit comprising:

a pre-stage gain block, comprising:

a pre-sample circuit, for receiving and sampling the first signal set during a first period, and holding the first signal set sampled as a third signal set; and a pre-amplifier circuit, for receiving and amplifying the third signal set during a second period, and outputting a 4th signal set; and a post-stage gain block, connected to the pre-stage gain block, the post-stage gain block comprising:

a post-sample circuit, for receiving and sampling the 4th signal set during the second period, and holding the 4th signal set sampled as a 5th signal set;

a post-amplifier circuit, for receiving and amplifying the 5th signal set during the first period, and outputting the second signal set;

a common operational amplifier, comprising:

an operational amplifier circuit, for receiving and amplifying a 6th signal set, and outputting a 7th signal set correspondingly;

a multiplexer circuit, connected to the operational amplifier circuit, the pre-amplifier circuit and the post-amplifier circuit, for receiving the third signal set and the 5th signal set, selecting the 5th signal set and the third signal during the first period and the second period respectively, and outputting the 6th signal set; and a demultiplexer circuit, connected to the operational amplifier circuit, the pre-amplifier circuit and the post-amplifier circuit, for receiving and switching the 7th signal set during the first period and the second period to provide the second signal set and the 4th signal set respectively.

5. The pipeline gain circuit of claim 4, wherein the pipeline gain circuit is adopted for a readout circuit of an image sensor.

6. The pipeline gain circuit of claim 5, wherein the image sensor comprises a complementary metal oxide semiconductor (CMOS) image sensor.

7. A pipeline analog/digital (A/D) converter circuit, for receiving a first analog signal and outputting a first digital signal correspondingly, the A/D converter circuit comprising:

a pre-A/D converter, comprising:

a pre-sample and converter circuit, for receiving and sampling/holding a first analog signal to be a second analog signal during a first period, the second analog signal is converted into a second digital signal correspondingly, and the second digital signal is converted into a third analog signal correspondingly, then the third analog signal is subtracted from the second analog signal to obtain and output a 4th analog signal, wherein the second digital signal is a first portion bit signal of the first digital signal; and a pre-amplifier circuit, for receiving and amplifying the 4th analog signal during a second period, and outputting a 5th analog signal; and a post-A/D converter, connected to the pre-A/D converter, the post-A/D converter comprising:

a post-sample and converter circuit, for receiving and sampling/holding the 5th analog signal to be a 6th analog signal during the first period, the 6th analog signal is converted into a third digital signal correspondingly, and the third digital signal is converted into a 7th analog signal correspondingly, then the 7th analog signal is subtracted from the 6th analog signal to obtain and output an 8th analog signal, wherein the third digital signal is a second portion bit signal of the first digital signal;

a post-amplifier circuit, for receiving and amplifying the 8th analog signal during the first period, and outputting a 9th analog signal;

a common operational amplifier, comprising:

an operational amplifier circuit, for receiving and amplifying a 11thalog signal, and outputting a 11 th analog signal correspondingly;

a multiplexer circuit, connected to the operational amplifier circuit, the pre-amplifier circuit and the post-amplifier circuit, for receiving the 4th analog signal and the 8th analog signal, selecting the 8th analog signal and the 4th analog signal during the first period and the second period respectively, and outputting the 11thalog signal; and a demultiplexer circuit, connected to the operational amplifier circuit, the pre-amplifier circuit and the post-amplifier circuit, for receiving and switching the 11 th analog signal during the first period and the second period to provide the 9th analog signal and the 5th analog signal respectively.

8. The pipeline A/D converter circuit of claim 7, wherein the pipeline A/D converter circuit is adopted as a readout circuit of an image sensor.

9. The pipeline A/D converter circuit of claim 8, wherein the image sensor comprises a complementary metal oxide semiconductor (CMOS) image sensor.

* * * * *